US007354640B2

(12) United States Patent
Kubota

(10) Patent No.: US 7,354,640 B2
(45) Date of Patent: Apr. 8, 2008

(54) HARD COATING AND ITS PRODUCTION METHOD

(75) Inventor: Kazuyuki Kubota, Chiba-ken (JP)

(73) Assignee: Hitachi Tool Engineering, Ltd., Tokyo (JP)

( * ) Notice: Subject to any disclaimer, the term of this patent is extended or adjusted under 35 U.S.C. 154(b) by 307 days.

(21) Appl. No.: 11/153,350

(22) Filed: Jun. 16, 2005

(65) Prior Publication Data
US 2005/0284747 A1 Dec. 29, 2005

(30) Foreign Application Priority Data

Jun. 18, 2004 (JP) .................. 2004-181342
Jun. 10, 2005 (JP) .................. 2005-171022

(51) Int. Cl.
*C23C 14/00* (2006.01)
(52) U.S. Cl. .................. 428/216; 428/336; 428/698; 428/699; 428/701
(58) Field of Classification Search ............ 428/698, 428/699, 701, 216, 336
See application file for complete search history.

(56) References Cited

U.S. PATENT DOCUMENTS 6,824,601 B2 * 11/2004 Yamamoto et al. ...... 106/286.2
2001/0008707 A1 7/2001 Eerden et al.

FOREIGN PATENT DOCUMENTS

| EP | 0709483 A2 | 5/1996 |
| JP | 64-083656 | 3/1989 |
| JP | 06063804 | 8/1994 |
| JP | 07-205362 | 8/1995 |
| JP | 08-127863 | 5/1996 |
| JP | 08-170167 | 7/1996 |
| JP | 2000-326108 | 11/2000 |
| JP | 2001-29361 | 10/2001 |
| JP | 2003-225807 | 8/2003 |
| WO | WO 97/04142 | 2/1997 |

OTHER PUBLICATIONS

Lattemann, M.; Ulrich, S.; Holleck, H.; Stüber, M.; Leiste, H. "Characterisation of silicon carbide and silicon nitride thin films and $Si_3N_4$/SiC multilayers," Diamond and Related Materials, Mar. 2002, pp. 1248-1253, vol. 11, No. 3-6, Elsevier Science Publishers, Amesterdam, Netherlands.
Park, In-Wook; Choi, Sung Ryong; Lee, Mi-Hye; Kim, Kwang Ho. "Effects of Si addition on the microstructural evolution and hardness of Ti-Al-Si-N films prepared by the hybrid system of arc iron plating and sputtering techniques," Journal of Vacuum Science and Technology A. Vacuum, Surfaces and Films, Jul. 2003, pp. 895-899, vol. 21, No. 4, American Institute of Physics, New York, NY.

* cited by examiner

*Primary Examiner*—Archene Turner
(74) *Attorney, Agent, or Firm*—Sughrue Mion, PLLC

(57) ABSTRACT

A hard coating formed by a physical vapor deposition method, comprising metal elements comprising Si and at least one selected from the group consisting of transition metal elements of Groups 4a, 5a and 6a in the Periodic Table, Al and B, and at least one non-metal element selected from the group consisting of C, N and O, the hard coating having a columnar structure comprising a multi-layer structure composed of pluralities of layers with Si content differences, crystal lattice stripes being continuous in the interlayer boundary regions, and each layer having a thickness of 0.1-100 nm.

8 Claims, 7 Drawing Sheets

HARD COATING AND ITS PRODUCTION METHOD

FIELD OF THE INVENTION

The present invention relates to a hard coating having excellent wear resistance, adhesion, high-temperature oxidation resistance, toughness, etc., which is formed on a substrate of cemented carbide, cermet, high-speed steel, die steel, etc., and a method for producing such a hard coating.

BACKGROUND OF THE INVENTION

As high-speed metal cutting at a feed per one edge exceeding 0.3 mm becomes prevailing, conventional hard-coated tools have become insufficient in oxidation resistance, wear resistance, seizure resistance, peel resistance, etc. of hard coatings. Accordingly, various technologies have been proposed to improve oxidation resistance, wear resistance, seizure resistance, peel resistance, etc. of the hard coatings.

JP 2003-225807 A discloses a cutting tool having a hard coating layer exhibiting excellent wear resistance in high-speed cutting, the hard coating layer being formed by physically depositing a composite nitride of Ti and Y to an average thickness of 1-15 µm on a substrate of tungsten carbide-based cemented carbide or titanium carbonitride cermet, the hard coating layer having maximum-Y-component points (minimum-Ti-component points) and Y-component-free points (TiN points) alternately at a predetermined interval in a layer thickness direction, the concentration of the Y component changing smoothly between the maximum-Y-component point and the Y-component-free point, the maximum-Y-component points having a composition represented by the formula of $(Ti_{1-x}Y_x)N$, wherein x is 0.05-0.15 by atomic ratio, an interval between the adjacent maximum-Y-component point and the Y-component-free point being 0.01-0.1 µm.

Japanese Patent 3,460,288 discloses a wear-resistant coated member comprising a substrate and a hard coating formed on its surface, the hard coating being formed by layers of nitrides, oxides, carbides, carbonitrides or borides of 2 or more elements selected from the group consisting of metal elements of Groups 4a, 5a and 6a, Al and Si, such that their compositions change continuously at a period of 0.4 nm to 50 nm to a total thickness of 0.5-10 µm.

Both hard coatings of JP 2003-225807 A and Japanese Patent 3,460,288 are multi-layer coatings having repeatedly changing concentrations or compositions. However, because any of the above technologies uses only an arc-discharge ion plating method, they do not necessarily have satisfactory seizure resistance in the cutting of steel, etc., on which seizure tends to occur.

JP 64-83656 A discloses a method for producing a hard coating by an electron beam method using a heated filament and a magnetron sputtering method in a vacuum chamber. However, because the electron beam method generates a low plasma density, the resultant hard coating has much lower adhesion than those obtained by an arc-discharge ion-plating method. Accordingly, hard coatings obtained by this method do not have sufficient hardness, strength and toughness.

JP 8-170167 A discloses on a wear-resistant hard coating formed on a substrate surface, comprising a first layer on the substrate side having a chemical composition represented by $(Al_xTi_{1-x-y}Si_y)(C_zN_{1-z})$, wherein $0.05 \leq x \leq 0.75$, $0.01 \leq y \leq 0.1$, and $0 \leq z \leq 0.4$, and a second layer on the surface side comprising BN.

JP 2000-326108 A discloses a tool having a hard coating formed on a substrate made of high-speed steel, cemented carbide, cermets or ceramics, the hard coating comprising a C layer made of a nitride of a Ti-based metal and having a thickness of 0.1-1 µm, an A layer made of a nitride, carbonitride, oxinitride or oxicarbonitride of a metal comprising 10-60 atomic % of Si, and less than 10 atomic % of at least one selected from the group consisting of B, Al, V, Cr, Y, Zr, Nb, Mo, Hf, Ta and W, the balance being Ti, based on the metal only, which comprises $Si_3N_4$ and Si as independent phases, and a B layer made of a nitride, carbonitride, oxinitride or oxicarbonitride of a metal comprising more than 40 atomic % and 75 atomic % or less of Al, and less than 10 atomic % of at least one selected from the group consisting of B, Si, V, Cr, Y, Zr, Nb, Mo, Hf, Ta and W, the balance being Ti, based on the metal only, one or more A layers and one or more B layers being alternately formed, and the B layer being formed immediately on the C layer.

In JP 8-170167 A and JP 2000-326108 A, however, only an arc-discharge ion-plating method is carried out, thereby providing insufficient seizure resistance in the cutting of steel vulnerable to seizure in its edge, etc.

JP 8-127863 A discloses a wear-resistant, hard laminate coating comprising as main components at least one element selected from the group consisting of elements of Groups IVa, Va and VIa in the Periodic Table, Al, Si and B, and at least one element selected from the group consisting of B, C, N and O, the coating having at least 2 types of compound layers having different compositions and composition-changing layers, whose element compositions change in a thickness direction between the compound layers, the compound layers and the composition-changing layers being periodically laminated, and a crystal lattice being continuous over one period or more between the layers.

JP 11-509580 A discloses a method for forming a high-lubrication, hard coating comprising, for instance, molybdenum disulfide and TiN on a cutting tool, using a sputtering-ion plating system comprising a first target made of a metal sulfide (for instance, molybdenum disulfide), and a second target made of at least one metal selected from the group consisting of titanium, vanadium, chromium, zirconium, niobium, molybdenum, tantalum, hafnium and tungsten.

However, JP 8-127863 A and JP 11-509580 A do not provide hard coatings with sufficient adhesion and hardness, failing to sufficiently improve the wear resistance of cutting tools.

Japanese Patent 3,416,938 discloses a laminated hard coating comprising a compound layer mainly composed of at least one first element selected from the group consisting of metal elements in Groups IVa, Va and VIa in the Periodic Table, Al, Si and B, and at least one second element selected from the group consisting of C, N and O, and a composition-changing layer of TiC, BC, WC, TiCN, TiN, TiB, TiBN, BN, SiN, etc., the compound layers and the composition-changing layers being laminated such that a composition periodically changes in a thickness direction, and a crystal lattice being continuous with deformation in the composition-changing layer.

JP 2001-293601 A discloses a cutting tool having a wear-resistant hard coating formed on a tool substrate, the coating comprising as a main component a nitride or carbonitride of at least one element selected from the group consisting of elements of Groups 4a, 5a and 6a in the Periodic Table and Al, the substrate being made of at least one selected from the group consisting of WC-based cemented carbide, cermet, silicon carbide, silicon nitride, aluminum nitride, alumina, boron carbide, sintered aluminum oxide-titanium carbide, high-speed steel, die steel and stainless steel, the wear-resistant, hard coating containing at least one type of fine, hard particles selected from the group consisting of $B_4C$, BN, $TiB_2$, TiB, TiC, WC, SiC, $SiN_x$ (x=0.5-1.33) and $Al_2O_3$.

However, any of the hard coatings described in Japanese Patent 3,416,938 and JP 2001-293601 A fails to meet the demand of having sufficient lubrication capable of withstanding dry cutting conditions while maintaining oxidation resistance and wear resistance.

OBJECTS OF THE INVENTION

Accordingly, an object of the present invention is to provide a hard coating with improved toughness while keeping hardness, wear resistance, oxidation resistance, seizure resistance, lubrication, adhesion to a substrate, etc., thereby usable for dry cutting, high-speed cutting and high-feed cutting, and its production method.

DISCLOSURE OF THE INVENTION

The hard coating of the present invention is formed by a physical vapor deposition method, and comprises metal elements comprising Si and at least one selected from the group consisting of transition metal elements of Groups 4a, 5a and 6a in the Periodic Table, Al and B, and at least one non-metal element selected from the group consisting of C, N and O, the hard coating having a columnar structure comprising a multi-layer structure composed of pluralities of layers with Si content differences, crystal lattice stripes being continuous in interlayer boundary regions, and each layer having a thickness of 0.1-100 nm.

In the above hard coating, a Si-containing crystalline phase preferably comprises $\alpha$-$Si_3N_4$ and $\beta$-$Si_3N_4$. The above hard coating preferably has bonds of Si and O. A surface of the hard coating is preferably made smooth by machining.

The method of the present invention for producing a hard coating having a multi-layer structure having crystal grains continuously grown without interfaces, on a substrate surface, comprises simultaneously discharging two or more physical vapor deposition sources having different plasma densities, to form a first layer by an evaporation source having a higher plasma density and a second layer by an evaporation source having a lower plasma density.

In the above method, the evaporation source having a higher plasma density is preferably an arc-discharge ion-plating target, and the evaporation source having a lower plasma density is preferably a magnetron sputtering target.

BEST MODE FOR CARRYING OUT THE INVENTION

[1] Hard Coating (1) Composition

Figure 1:
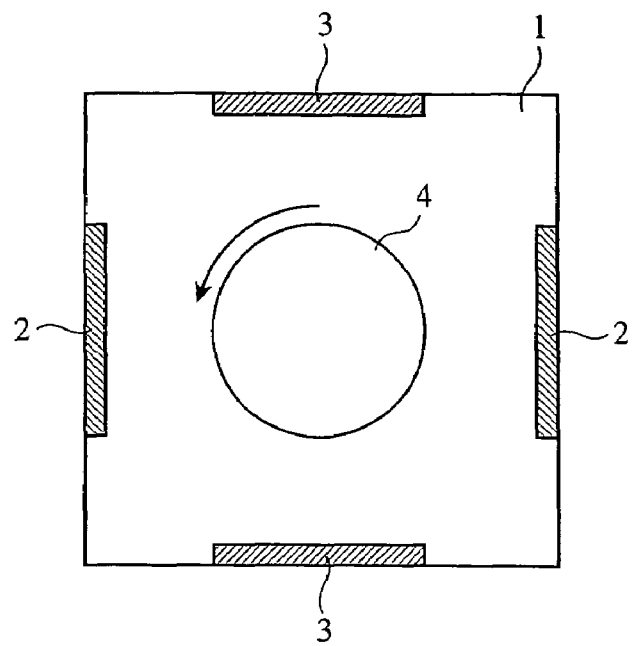
FIG. 1 is a schematic view showing a small vacuum chamber apparatus comprising evaporation sources having different plasma densities for physical vapor deposition to form the hard coating of the present invention.

The composition of the hard coating of the present invention comprises metal elements comprising Si and at least one selected from the group consisting of transition metal elements of Groups 4a, 5a and 6a in the Periodic Table, Al and B, and at least one non-metal element selected from the group consisting of C, N and O. In a surface layer of the Si-containing hard coating of the present invention, a dense Si oxide is formed at high temperatures. For instance, when the hard coating of the present invention is formed on a cutting tool, a dense Si oxide is formed near surface by heat generated during cutting, thereby reducing the diffusion of Fe in a work into the hard coating, and thus suppressing seizure.

The content of Si is preferably 0.1-30 atomic % based on 100 atomic % of all the metal elements. When the Si content exceeds 30 atomic %, the structure of the hard coating on a fractured surface changes from a columnar structure to a fine grain structure, though its hardness and thermal resistance are improved. A hard coating having a fine grain structure has many crystal grain boundaries, through which oxygen in the air and Fe in a work are easily diffused by heat generated during cutting. As a result, seizure occurs at cutting edges, resulting in deteriorated lubrication. Accordingly, the structure of the hard coating on a fractured surface is also an important factor, and it is particularly important in a high-feed cutting operation that the fractured surface has a columnar structure. Further, when the Si content exceeds 30 atomic %, the hard coating has an increased residual stress, resulting in easy peeling occurring in an interface between the substrate and the hard coating. Because seizure occurs in peeled portions, it is important to prevent peeling. On the other hand, when the Si content is less than 0.1 atomic %, the effect of adding Si is insufficient.

Because B increases the hardness and lubrication of a hard coating, a tool with a hard coating containing B has a long life. The improvement of hardness is obtained by a c-BN phase, and the improvement of lubrication is obtained by an h-BN phase. With an optimum ratio of B to N, improved hardness and lubrication can be given to the hard coating. The ratio of the c-BN phase to the h-BN phase can be controlled by a bias voltage applied during coating.

When the metal composition contains too much Al, $Al_2O_3$ is formed in a surface layer, resulting in the diffusion of Fe, etc. in a work into the hard coating in an actual cutting operation, though the hard coating has an improved static thermal resistance. Accordingly, the Al content is preferably 50 atomic % or less, based on 100 atomic % of all the metal elements. The more preferred Al content is 70-20 atomic %. When the Al content is 20% or more, the hard coating has sufficient wear resistance and oxidation resistance.

The non-metal component in the hard coating is selected from C, N and O. To improve lubrication, the O content is preferably 0.3-5 atomic % based on 100 atomic % of all the non-metal elements. When the O content exceeds 5 atomic %, the hardness of the hard coating decreases despite improvement in lubrication, accompanied by a fine crystal structure on a fractured surface, so that wear easily occurs.

A ratio n/m of the total amount (n atomic %) of non-metal elements to the total amount (m atomic %) of metal elements is preferably more than 1.0, more preferably 1.02 or more. The upper limit of n/m is preferably 1.7.

(2) Structure and Properties of Hard Coating

A transmission electron microscopic observation reveals that the hard coating of the present invention has pluralities of layers having contrast in brightness. These layers comprises layers having a larger Si content (layers A), and layers having a smaller Si content (layers B), the layers A and B being laminated alternately without interfaces. Composition analysis by an energy dispersive X-ray analyzer (EDX) attached to a TEM indicates that difference between an average Si content $Si_A$ in the layers A and an average Si content $Si_B$ in the layers B is 10% or less, preferably within 0.2-5%. When the difference between $Si_A$ and $Si_B$ is in a range of 0.2-5 atomic %, the hard coating has high impact resistance. With difference in the Si content between the layers A and B, it is possible to provide the hard coating with improved toughness and suppressed residual compression stress while keeping excellent lubrication.

The hard coating of the present invention has a columnar structure, whose columnar crystal grains have pluralities of layers having different Si contents without clear interfaces, with crystal lattice stripes continuous in interlayer boundary regions. The columnar structure is a crystal structure longitudinally grown in a thickness direction. Though the hard coating per se is polycrystalline, each crystal grain has a single-crystal-like structure. In addition, the columnar crystal grains have a multi-layer structure comprising pluralities of layers having different Si contents in a growth direction, with crystal lattice stripes continuous in interlayer boundary regions. The continuity of the crystal lattice stripes need not exist in all interlayer boundary regions, but there need only be interlayer boundary regions in which crystal lattice stripes are substantially continuous, when observed by a transmission electron microscope. With columnar crystal grains having a multi-layer structure comprising pluralities of layers having different Si contents, the hard coating has toughness as a whole.

The hard coating of the present invention preferably contains Si in the form of $Si_3N_4$ in a columnar crystal region and another region. The existence of $Si_3N_4$ is confirmed by Raman spectroscopy. $Si_3N_4$ has an α-crystal structure and a β-crystal structure. α-$Si_3N_4$ has a peak in a wave number range of 830-850 cm$^{-1}$, and β-$Si_3N_4$ has a peak in a wave number range of 1020-1070 cm$^{-1}$. α-$Si_3N_4$ is a softer crystalline phase, and β-$Si_3N_4$ is a harder crystalline phase, their existence contributing to improvement in the hardness and toughness of the hard coating. This appears to be due to the fact that the coexistence of the harder crystalline phase and the softer crystalline phase generates strain in the hard coating to make the hard coating harder by an increased internal stress, and that the cushioning effect of the softer crystalline phase contributes to increasing toughness.

The hard coating of the present invention preferably has Si—O bonds. Particularly the existence of Si—O bonds on a surface provides the hard coating with excellent lubrication, thereby suppressing severe seizure, for instance, at an early cutting stage. The Si—O bonds can be confirmed by a peak in a range of 100-105 eV in an X-ray photoelectron spectroscopy (XPS). XPS was conducted with an X-ray source of AlKα in an analysis region of 100 μm in diameter, using an electron neutralizer.

The friction coefficient of the hard coating is preferably 0.6 or less. When the friction coefficient exceeds 0.6, the lubrication of the hard coating is insufficient. The friction coefficient is measured at 600° C. in the air, using a ball-on-disc-type friction wear tester.

The thickness T of each layer in the hard coating is preferably 0.1-100 nm, more preferably 2-80 nm. Incidentally, T is a value (average value) obtained by dividing the measured thickness of pluralities of periodically changing layers by the number of the layers. When T exceeds 100 nm, strain is generated in interlayer boundary regions, resulting in discontinuous lattice stripes in the crystal grains, thereby lowering the mechanical strength of the hard coating. For instance, when the hard coating is formed on a cutting tool, laminar breakage occurs in the hard coating by cutting impact at an early cutting stage. The prevention of strain in interlayer boundary regions is effective to improve the adhesion of the hard coating to the substrate. The lower limit of T is 0.1 nm, the minimum thickness for observing a layer structure by an X-ray diffraction apparatus or a transmission electron microscope. Also, when a multi-layer, hard coating is formed at a lamination period less than 0.1 nm, the resultant coating has uneven properties. To control the thickness T of each layer in the multi-layer, hard coating having a columnar structure to 100 nm or less, and to make lattice stripes in each crystal grain continuous, the discharge output of an evaporation source in the MS method is preferably set at 6.5 kW or less. The hard coating of the present invention preferably has an average thickness (total thickness) of 0.5-10 μm.

[2] Production Method of Hard Coating

To produce the multi-layer, hard coating of the present invention, physical vapor deposition with different plasma densities is utilized. Specifically, a high-plasma-density, arc-discharge ion-plating (AIP) method and a low-plasma-density, magnetron sputtering (MS) method are simultaneously conducted in a reaction gas plasma to continuously grow crystal grains without interfaces, thereby providing crystal grains in the hard coating with large mechanical strength. On the contrary, when the AIP method and the MS method are conducted stepwise or intermittently, clear interfaces are generated between layers in the hard coating, providing the hard coating with smaller strength.

The AIP method generates high-density plasma by high-current discharge, thereby forming a layer having high hardness because of a high residual stress. Also, the AIP method of high-density plasma can uniformly form hard layers having complicated compositions with different melting points. However, the resultant hard layers are poor in toughness and impact resistance. On the other hand, layers formed by the low-plasma-density MS method have high toughness in addition to a small residual stress, low hardness and low adhesion to a substrate, because of low energy of metals ionized in the plasma and gas ions that impinge the substrate.

By conducting the AIP method and the MS method simultaneously, a hard coating having advantages of both methods can be obtained. Namely, a hard coating having a multi-layer structure comprising high-hardness layers and low-hardness layers alternately laminated has improved toughness and impact resistance as a whole by the cushioning effect of the low-hardness layers. Also, crystal grains continuously grow without interruption, so that a crystal grain extends over pluralities of layers without clear interfaces between layers. As a result, the hard coating obtained by simultaneously conducting the AIP method and the MS method has excellent hardness, wear resistance, lubrication, adhesion, breakage resistance, toughness, impact resistance, etc. To secure adhesion to the substrate, a lowermost layer closest to the substrate is preferably formed by the AIP method having high-plasma density.

Specifically as shown in FIG. 1, it is preferable to use a vacuum chamber apparatus 1 comprising AIP targets 2 and MS targets 3, and a reaction gas suitable for both of the AIP method and the MS method. The composition of each target per se is not restrictive. Each of the AIP target 2 and the MS target 3 may be a single-alloy target or pluralities of targets of metals or alloys having different compositions. Specifically, the AIP target is preferably composed of at least one selected from the group consisting of transition metal elements of Groups 4a, 5a and 6a in the Periodic Table, Al, B and Si. The MS target is preferably composed of at least one transition metal element of Groups 4a, 5a and 6a in the Periodic Table and Si. The reaction gas is preferably an $N_2$ gas, a $CH_4$ gas, an $Ar/O_2$ mixed gas, etc. alone or in combination. The reaction gas pressure is selected such that the AIP method and the MS method can simultaneously generate plasma. To form Si—O bonds for improving lubrication, the reaction gas preferably contains oxygen.

When the AIP method and the MS method are simultaneously conducted in the reaction gas in a plasma state while bringing the substrate alternately closer to the targets 2, 3, ions with different valences simultaneously reach the substrate. When the substrate is closer to the evaporation source for the high-plasma-density AIP method, a hard layer is formed. And when it is closer to the evaporation source for the low-plasma-density MS method, a soft layer is formed. There is a region between the hard layer and the soft layer, in which a composition changes not discontinuously but gradually (without clear interface). With the soft layer sandwiched by the hard layers via a gradually-changing-composition region, there is a cushioning effect to provide the entire hard coating with excellent toughness and impact resistance.

As a result, the hard coating can be provided with improved mechanical strength such as toughness, etc., because even laminated layers of different compositions have no clear interfaces causing peeling and breakage. Further, simultaneous discharge of the AIP method and the MS method makes it possible to add high-melting-point materials and high-lubrication materials, whose plasma cannot be easily generated by the AIP method, to the hard coating. When the AIP method and the MS method are conducted simultaneously, deposition sources comprising AIP deposition sources generating a high-density plasma and MS deposition sources generating a low-density plasma, and a substrate to be coated are disposed, such that the substrate passes through both plasmas alternately to be laminated with deposited layers.

The MS method using a Si-containing target can form $Si_3N_4$ in the hard coating. $Si_3N_4$ comprises a softer α-crystal and a harder β-crystal having different crystal forms. A ratio of the α-crystal to the β-crystal can be controlled by film-forming conditions. Their existence in proper proportions can provide the hard coating with improved hardness, toughness and lubrication.

When the AIP method and the MS method are simultaneously conducted, current in the AIP method is preferably 100-150 A, and the discharge output of the MS target is preferably 6.5 kW or less, to form $Si_3N_4$ comprising an α-crystal and a β-crystal in proper proportions. The discharge output of the MS target of 3.5 kW or less produces a lower plasma density, making the α-$Si_3N_4$ more than the β-$Si_3N_4$, and thus resulting in an increased cushioning effect. It should be noted that because Si reaches the substrate to be accumulated in a hard coating being formed while the substrate passes through the plasma of the AIP method, Si is present in both hard and soft layers in a gradually and periodically changing proportion.

To generate plasma permitting the AIP method and the MS method to be conducted simultaneously, the reaction gas pressure is preferably 0.5-10 Pa, more preferably 1-8 Pa. When the reaction gas pressure is less than 0.5 Pa, discharge does not easily occur in the AIP method. In the AIP method, in which a magnetic field is preferably generated near a target to suppress the generation of macro-particles, a lot of macro-particles would be generated even with a magnetic field if the reaction gas pressure were too low, resulting in a hard coating with many internal defects. On the other hand, when the reaction gas pressure exceeds 10 Pa, discharge does not easily occur in the MS method, making it difficult to generate a uniform plasma.

When a cutting tool is provided with the hard coating of the present invention, the seizure of a work can be prevented because of excellent lubrication, adhesion and wear resistance. Particularly because the hard coating of the present invention has excellent lubrication, the seizure and diffusion of work elements can be suppressed in a dry cutting operation generating heat to high temperatures. The cutting tools having the above hard coating are usable in dry cutting, high-speed cutting, and high-feed cutting. The high-feed cutting is, for instance, cutting at a feed exceeding 0.3 mm/edge.

When the hard coating surface is made smooth by machining, the wear resistance is stabilized, resulting in reduced unevenness of tool life.

The formation of an intermediate layer made of at least one selected from the group consisting of nitrides, carbonitrides or boronitrides of Ti, TiAl alloys, Cr and W, etc. on a substrate surface increases the adhesion of the hard coating to the substrate, thereby improving the peel resistance and breakage resistance of the hard coating. A cutting tool provided with the hard coating of the present invention is not only suitable for dry cutting, but also usable for wet cutting. In any case, the existence of an intermediate layer can prevent the hard coating from being broken by repeated fatigue.

The materials of the cutting tool, on which the hard coating of the present invention is formed, are not restrictive, but may be cemented carbide, high-speed steel, die steel, etc. The hard coating of the present invention may be formed on wear-resistant members such as dies, bearings, rolls, piston rings, slidable members, etc., and heat-resistant members such as internal combustion engine parts, etc., which require high hardness, in addition to the cutting tools.

The present invention will be explained in further detail referring to Examples below without intention of restricting the present invention thereto.

EXAMPLE 1

Comparative Example 1

Using a small vacuum chamber apparatus 1 comprising AIP targets 2 and MS targets 3 as evaporation sources as shown in FIG. 1, a hard coating was formed on a substrate of a cemented carbide insert placed on a rotating table 4 in Example 1. Both of the AIP target 2 and the MS target 3 were made of a TiAl alloy. An $N_2$ gas was used as a reaction gas. With the pressure of the reaction gas set at 3.0 Pa, plasma was generated for both the AIP method and the MS method. The temperature of the substrate was set at 400° C., and a bias voltage was set at −40 V to −150 V. In Comparative Example 1, a hard coating was formed on an insert under the same conditions as in Example 1 except for using the AIP method only.

A hard coating of (TiAl)N obtained in Example 1 had high toughness, with a multi-layer structure comprising layers 21 obtained by the AIP method and layers 22 obtained by the MS method. In this multi-layer structure, crystals grew continuously without interruption. On the other hand, the hard coating of Comparative Example 1 obtained by the AIP method only had insufficient toughness despite hardness on the same level.

EXAMPLES 2-15

Comparative Examples 2-14 and Conventional Examples 1-5

Using a small vacuum chamber apparatus 1 comprising AIP targets 2 and MS targets 3 as evaporation sources as shown in FIG. 1, a hard coating was formed on a substrate of each cemented carbide insert placed on a rotating table 4 in Examples 2-15. The AIP targets 2 were made of alloys having various compositions, and the MS targets 3 were made of metal silicides as shown in Table 1. An $N_2$ gas, a $CH_4$ gas and an $Ar/O_2$ mixed gas were used alone or in proper combination depending on targeted hard coating compositions. To change the distribution of Si content in the hard coating in a lamination direction periodically and smoothly, plasma was generated at a reaction gas pressure of 3.0 Pa, simultaneously by both coating methods of AIP and MS. The discharging output of the MS targets 3 in each Example and Comparative Example was set as shown in Table 1. A substrate temperature was 400° C., and a bias voltage was −40 V to −150 V. In Comparative Examples 2-14, on the other hand, a hard coating was formed on each insert under the same conditions as in Examples except for changing the discharging output of the MS targets 3. In Conventional Examples 1-5, a hard coating was formed on each insert under the same conditions as in Examples except for conducting only the AIP method with the same plasma density. The conditions of forming the hard coatings are shown in Table 1.

The resultant hard coatings were measured with respect to a structure, a composition difference of Si, the continuity of crystal lattice stripes, the average thickness of each layer in the multi-layer structure, the existence of Si—O bonds, and a Si content. Each hard-coated insert attached to the following tool was subjected to a test of intermittently cutting a surface of a work having drilled holes at equal intervals under the following high-efficiency cutting conditions. The work was cut until it became uncuttable due to the breakage or wear of an insert edge, etc., to determine a cuttable length. The cuttable length is correlated with an insert life. The results are shown in Table 2.

| Cutting conditions | |
| --- | --- |
| Tool: | Face mill, |
| Insert shape: | SDE53 with special shape, |
| Cutting method: | Center cutting, |
| Work shape: | Width 100 mm × length 250 mm, |
| Work: | SCM440 (HB280) having many drilled holes of 10 mm in diameter, |
| Depth of cutting: | 2.0 mm, |
| Cutting speed: | 180 m/minute, |
| Feed per one edge: | 1.5 mm/edge, and |
| Cutting oil: | Not used. |

TABLE 1

| | AIP Target | MS target | | | $O_2$ in |
| --- | --- | --- | --- | --- | --- |
| No. | Composition (atomic %) | Composition | Discharge Output (kW) | Coating Method | Reaction Gas |
| Example 2 | (50Ti—50Al) | $WSi_2$ | 1.2 | MS + AIP | Yes |
| Example 3 | (45Ti—55Al) | $NbSi_2$ | 1.3 | MS + AIP | Yes |
| Example 4 | (45Ti—55Al) | $CrSi_2$ | 1.5 | MS + AIP | Yes |
| Example 5 | (50Ti—50Al) | WSi | 1.7 | MS + AIP | Yes |
| Example 6 | (34Ti—66Al) | $WSi_2$ | 3.5 | MS + AIP | Yes |
| Example 7 | (50Ti—50Al) | CrSi | 1.0 | MS + AIP | Yes |
| Example 8 | (50Ti—40Al—10Cr) | WSi | 1.2 | MS + AIP | Yes |
| Example 9 | (50Ti—40Al—10Cr) | NbSi | 2.4 | MS + AIP | Yes |
| Example 10 | (50Ti—40Al—10Nb) | $NbSi_2$ | 6.5 | MS + AIP | Yes |
| Example 11 | (40Ti—50Al—10Nb) | WSi | 1.1 | MS + AIP | Yes |
| Example 12 | (50Ti—40Al—10B) | $TiSi_2$ | 1.2 | MS + AIP | Yes |
| Example 13 | (40Ti—50Al—10Cr) | $WSi_2$ | 1.2 | MS + AIP | Yes |
| Example 14 | (60Cr—40Al) | $WSi_2$ | 3.9 | MS + AIP | Yes |
| Example 15 | (40Cr—60Al) | $CrSi_2$ | 6.0 | MS + AIP | Yes |
| Comp. Ex. 2 | (50Ti—50Al) | $WSi_2$ | 6.9 | MS + AIP | No |
| Comp. Ex. 3 | (45Ti—55Al) | $NbSi_2$ | 8.0 | MS + AIP | No |

TABLE 1-continued

| No. | AIP Target Composition (atomic %) | MS target Composition | Discharge Output (kW) | Coating Method | $O_2$ in Reaction Gas |
|---|---|---|---|---|---|
| Comp. Ex. 4 | (45Ti—55Al) | $CrSi_2$ | 6.6 | MS + AIP | Yes |
| Comp. Ex. 5 | (50Ti—50Al) | WSi | 7.4 | MS + AIP | Yes |
| Comp. Ex. 6 | (34Ti—66Al) | $WSi_2$ | 7.0 | MS + AIP | No |
| Comp. Ex. 7 | (50Ti—50Al) | CrSi | 10.2 | MS + AIP | Yes |
| Comp. Ex. 8 | (50Ti—40Al—10Si) | WSi | 0.5 | MS + AIP | No |
| Comp. Ex. 9 | (40Ti—50Al—10Si) | NbSi | 0.5 | MS + AIP | No |
| Comp. Ex. 10 | (50Ti—40Al—10Nb) | $NbSi_2$ | 0.5 | MS + AIP | No |
| Comp. Ex. 11 | (40Ti—50Al—10Nb) | WSi | 9.6 | MS + AIP | Yes |
| Comp. Ex. 12 | (50Ti—40Al—10Cr) | $TiSi_2$ | 11.3 | MS + AIP | No |
| Comp. Ex. 13 | (40Ti—50Al—10Cr) | $WSi_2$ | 10.6 | MS + AIP | No |
| Comp. Ex. 14 | (40Cr—60Al) | $CrSi_2$ | 8.0 | MS + AIP | No |
| Conventional Ex. 1 | Two Layers TiN/(TiAlSi)N | — | — | AIP | — |
| Conventional Ex. 2 | One Layer (TiAl)N | — | — | AIP | — |
| Conventional Ex. 3 | Two Layers (TiAl)(CN)/(TiSi)N | — | — | AIP | — |
| Conventional Ex. 4 | One Layer (TiAlSi)N | — | — | AIP | — |
| Conventional Ex. 5 | Two Layers (TiAl)N/(TiSi)N | — | — | AIP | — |

TABLE 2

| No. | Structure | Crystal Lattice Stripes | Average Thickness T of One Layer (nm) |
|---|---|---|---|
| Example 2 | Columnar | Continuous | 72.2 |
| Example 3 | Columnar | Continuous | 36.4 |
| Example 4 | Columnar | Continuous | 64.1 |
| Example 5 | Columnar | Continuous | 90.1 |
| Example 6 | Columnar | Continuous | 14.3 |
| Example 7 | Columnar | Continuous | 98.5 |
| Example 8 | Columnar | Continuous | 74.3 |
| Example 9 | Columnar | Continuous | 45.1 |
| Example 10 | Columnar | Continuous | 3.8 |
| Example 11 | Columnar | Continuous | 60.2 |
| Example 12 | Columnar | Continuous | 22.4 |
| Example 13 | Columnar | Continuous | 8.0 |
| Example 14 | Columnar | Continuous | 31.2 |
| Example 15 | Columnar | Continuous | 2.6 |
| Comp. Ex. 2 | Fine | Interrupted | 7.8 |
| Comp. Ex. 3 | Fine | Interrupted | 90.2 |
| Comp. Ex. 4 | Columnar | Continuous | 132.1 |
| Comp. Ex. 5 | Fine | Interrupted | 103.3 |
| Comp. Ex. 6 | Fine | Interrupted | 3.6 |
| Comp. Ex. 7 | Fine | Interrupted | 7.0 |
| Comp. Ex. 8 | Columnar | Continuous | 0.3 |
| Comp. Ex. 9 | Columnar | Continuous | 0.4 |
| Comp. Ex. 10 | Columnar | Continuous | 31.4 |
| Comp. Ex. 11 | Fine | Interrupted | 155.2 |
| Comp. Ex. 12 | Fine | Interrupted | 4.1 |
| Comp. Ex. 13 | Fine | Interrupted | 11.0 |
| Comp. Ex. 14 | Fine | Interrupted | 2.4 |
| Conventional Ex. 1 | Columnar | Interrupted at Interface | — |
| Conventional Ex. 2 | Columnar | — | — |
| Conventional Ex. 3 | Columnar | Interrupted at Interface | — |
| Conventional Ex. 4 | Columnar | — | — |
| Conventional Ex. 5 | Columnar | Interrupted at Interface | — |

| No. | Si Content[1] | Si—O Bonds | $Si_A$[2] (at. %) | $Si_B$[3] (at. %) | Si Content Difference[4] | Cuttable Length (m) |
|---|---|---|---|---|---|---|
| Example 2 | 0.3 | Yes | 0.5 | 0.1 | Yes | 47.6 |
| Example 3 | 0.2 | Yes | 0.3 | 0.1 | Yes | 60.2 |

TABLE 2-continued

| | (1) | | (2) | (3) | | |
|---|---|---|---|---|---|---|
| Example 4 | 1.3 | Yes | 2.2 | 0.4 | Yes | 53.2 |
| Example 5 | 3.7 | Yes | 6.2 | 1.2 | Yes | 44.3 |
| Example 6 | 6.9 | Yes | 10.6 | 3.2 | Yes | 61.8 |
| Example 7 | 4.6 | Yes | 8.7 | 0.5 | Yes | 43.3 |
| Example 8 | 0.7 | Yes | 0.5 | 0.1 | Yes | 59.3 |
| Example 9 | 7.7 | Yes | 11.2 | 4.2 | Yes | 55.7 |
| Example 10 | 14.8 | Yes | 21.0 | 8.6 | Yes | 67.9 |
| Example 11 | 0.2 | Yes | 0.3 | 0.1 | Yes | 52.4 |
| Example 12 | 0.3 | Yes | 0.4 | 0.1 | Yes | 60.2 |
| Example 13 | 1.6 | Yes | 2.2 | 1.0 | Yes | 64.1 |
| Example 14 | 29.5 | Yes | 29.8 | 29.2 | Yes | 59.2 |
| Example 15 | 21.9 | Yes | 25.4 | 18.4 | Yes | 65.3 |
| Comp. Ex. 2 | 36.2 | No | 37.2 | 35.2 | Yes | 8.7[5] |
| Comp. Ex. 3 | 35.1 | No | 36.0 | 34.2 | Yes | 11.8[5] |
| Comp. Ex. 4 | 9.4 | Yes | 10.0 | 8.8 | Yes | 13.2[5] |
| Comp. Ex. 5 | 35.4 | Yes | 39.6 | 31.2 | Yes | 11.1[5] |
| Comp. Ex. 6 | 33.0 | No | 35.1 | 30.9 | Yes | 15.7[5] |
| Comp. Ex. 7 | 34.5 | Yes | 50.2 | 18.8 | Yes | 14.3[5] |
| Comp. Ex. 8 | Undetectable | No | — | — | Undetectable | —[6] |
| Comp. Ex. 9 | Undetectable | No | — | — | Undetectable | 0.3[7] |
| Comp. Ex. 10 | 6.9 | No | 10.6 | 3.2 | Yes | 18.5[5] |
| Comp. Ex. 11 | 34.6 | Yes | 44.3 | 24.9 | Yes | 11.8[8] |
| Comp. Ex. 12 | 35.7 | No | 40.6 | 30.8 | Yes | 11.3[9] |
| Comp. Ex. 13 | 35.9 | No | 38.7 | 33.1 | Yes | 8.5[10] |
| Comp. Ex. 14 | 33.5 | No | 35.5 | 31.5 | Yes | 15.4[11] |
| Conventional Ex. 1 | — | — | — | — | No | 6.2[12] |
| Conventional Ex. 2 | — | — | — | — | No | —[13] |
| Conventional Ex. 3 | — | — | — | — | No | —[14] |
| Conventional Ex. 4 | — | — | — | — | No | 7.7[15] |
| Conventional Ex. 5 | — | — | — | — | No | 10.2[16] |

Note:
[1] Si content in the entire hard coating.
[2] Average Si content in a layer having a larger Si content.
[3] Average Si content in a layer having a smaller Si content.
[4] Difference between $Si_A$ and $Si_B$.
[5] Broken.
[6] Because of large seizure, cutting was stopped.
[7] Because of large seizure at an early cutting stage, spark occurred.
[8] Because of large wear at an early cutting stage, the hard coating was broken.
[9] Because the hard coating peeled, evaluation was stopped.
[10] Because spark occurred, evaluation was stopped.
[11] Despite good cutting performance at an early stage, the hard coating wore rapidly and was broken.
[12] After early peeling of (TiAlSi)N, the hard coating was broken.
[13] Peeling occurred early, and the hard coating was broken.
[14] Because of early peeling of (TiSi)N, evaluation was stopped.
[15] Because of early peeling of (TiAlSi)N, the hard coating was broken.
[16] Though evaluation was continued after the peeling of (TiSi)N, spark occurred.

Figure 2:
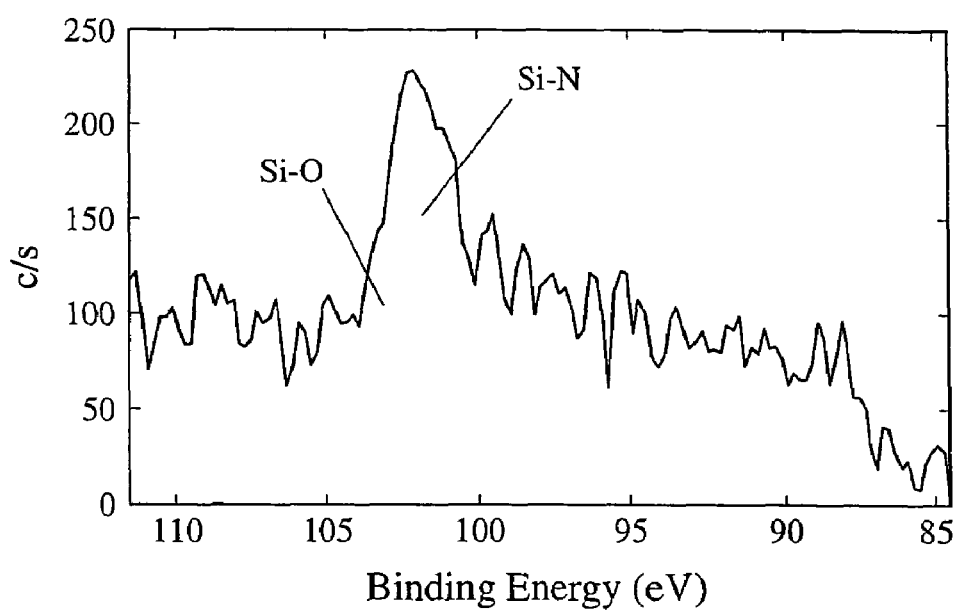
FIG. 2 is a graph showing XPS analysis results of the hard coating of Example 10.
Figure 3:
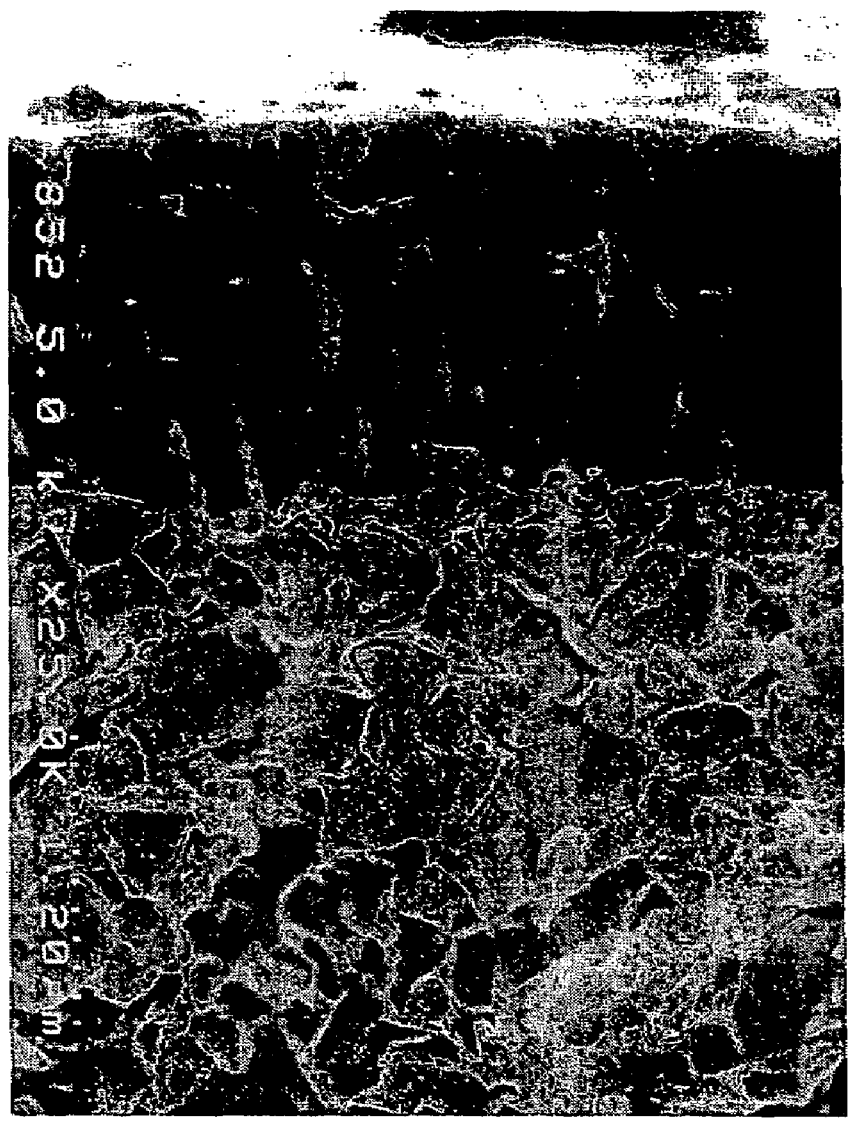
FIG. 3 is a scanning electron photomicrograph (magnification: 15,000) showing the structure of the hard coating of Example 10 on a fractured surface.

As is clear from Table 2, inserts having the hard coatings of Examples 2-15 can perform high-efficiency cutting. With Si—O bonds present on the hard coating surface, and with interlayer variations in the Si content, they would be able to conduct an extremely long cutting operation. Particularly the hard coating (containing Si from $NbSi_2$) of Example 10 exhibited the best cutting performance. As shown in FIG. 2, the hard coating of Example 10 had Si—O bonds in a range of 100-105 eV in XPS. It is considered that the existence of Si—O bonds suppressed seizure at an early cutting stage. Because dense oxides having excellent lubrication were formed in a surface layer of the hard coating of Example 10, the seizure of a work metal was remarkably suppressed. In addition, because an MS target of $NbSi_2$ was used at a discharge output of 6.5 kW, the entire hard coating had a Si content of 14.8 atomic %, within the range of the present invention. As shown in FIG. 3, the observation of a structure on a fractured surface by a scanning electron microscope (SEM, magnification: 15,000) revealed that the hard coating of Example 10 had a columnar structure. It was confirmed that the hard-coated inserts having such compositions and structures had excellent mechanical strength in a shear direction in cutting operations with severe impact, such as high-feed working, etc.

Figure 4:
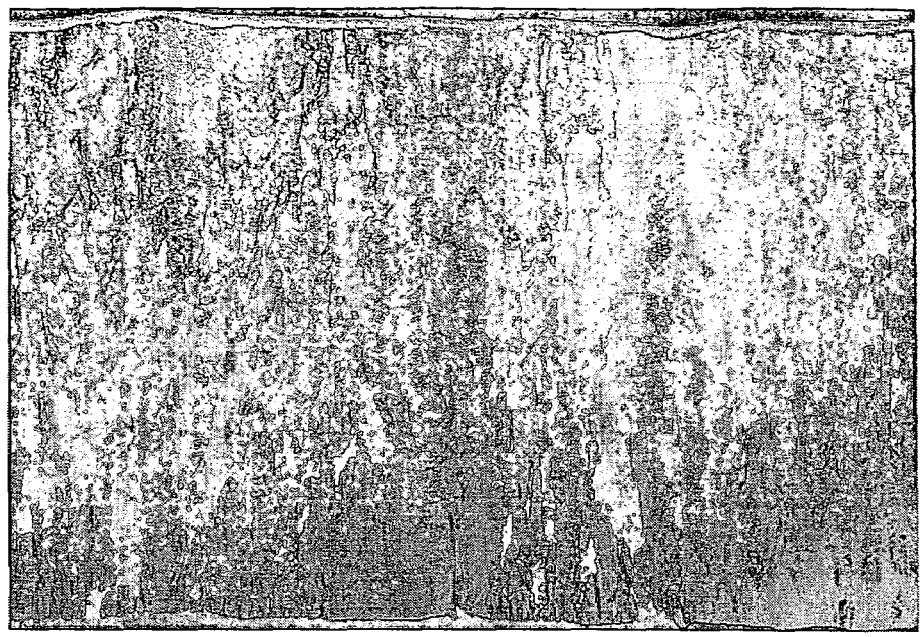
FIG. 4 is a transmission electron photomicrograph (magnification: 20,000) showing the structure of the hard coating of Example 10 on a fractured surface.

It is clear from FIG. 4, a transmission electron photomicrograph (magnification: 20,000) of a fractured surface of the hard coating of Example 10, that each crystal grain in the hard coating having a columnar structure had a multi-layer structure. It is also clear from FIG. 5, a transmission electron photomicrograph (magnification: 200,000) of part of the crystal grain shown in FIG. 4, that the crystal grain had a multi-layer structure comprising pluralities of alternately laminated clear-contrast layers (black layers and gray layers). It was confirmed by electron diffraction that each crystal grain grew in substantially the same direction perpendicular to the substrate surface. It is clear from the stripe pattern shown in FIG. 5 that each layer was as thick as about 3-4 nm on average. Incidentally, the numbers of stripes are not equal between FIGS. 4 and 5 because of difference in magnification.

Figure 5:
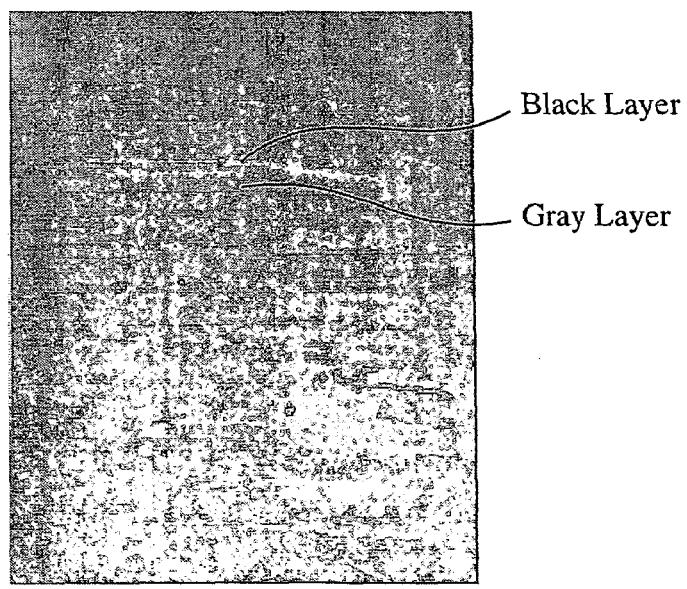
FIG. 5 is a transmission electron photomicrograph (magnification: 200,000) showing the structure of crystal grains in a region shown in FIG. 4.
Figure 6:
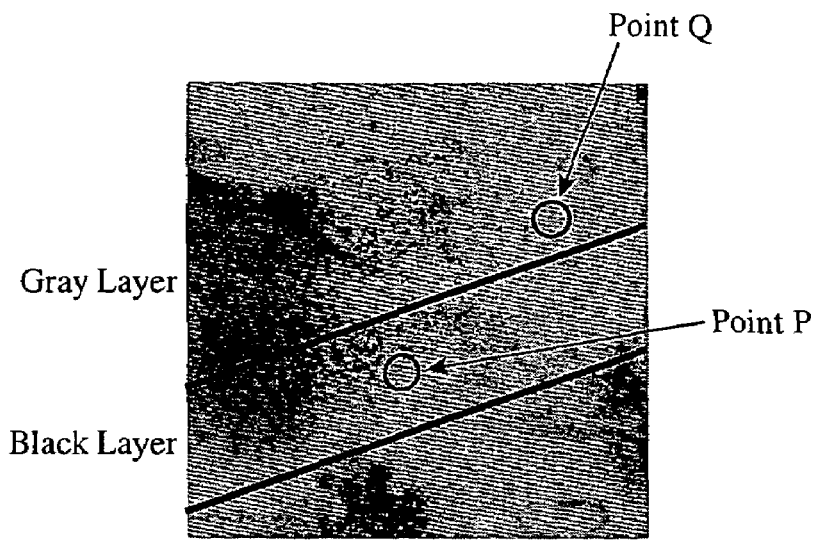
FIG. 6 is a transmission electron photomicrograph (magnification: 2,000,000) showing black layers and gray layers in a region shown in FIG. 5.
Figure 7:
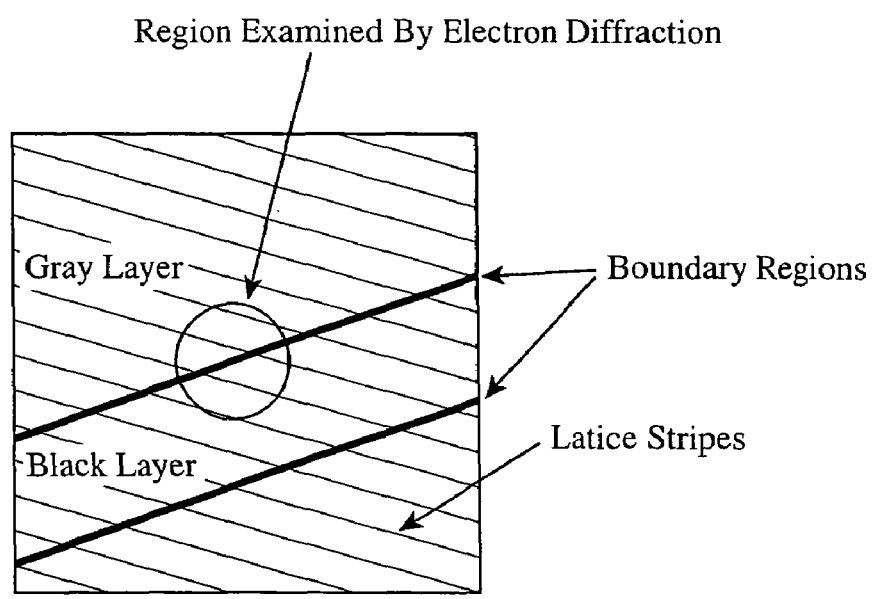
FIG. 7 is a schematic view corresponding to FIG. 6.

Part of the field of FIG. 5 was further observed by a magnification of 2,000,000, and the result is shown in FIG. 6. The observation region of FIG. 6 was magnified while confirming the positions of black layers and gray layers in FIG. 5, so that the black layers and the gray layers in FIG. 6 correspond to those in FIG. 5. Two lines depicted in FIG. 6 separate regions corresponding to the black layers and the gray layers. FIG. 7 is a schematic view corresponding to the photograph of FIG. 6. It should be noted that the interval of lattice stripes is expanded for explanation. It is clear from FIG. 6 that crystal lattice stripes were continuous in interlayer boundary regions in the multi-layer structure. The crystal lattice stripes need not have continuity in all boundary regions, but there need only be regions having continuity in lattice stripes in a transmission electron photomicrograph. Though there is a black region on the left side of FIG. 6, this has nothing to do with the black layer shown in FIG. 5.

Figure 8:
FIG. 8 is an electron diffraction image of a region enclosed by a circle in FIG. 7.
Figure 9:
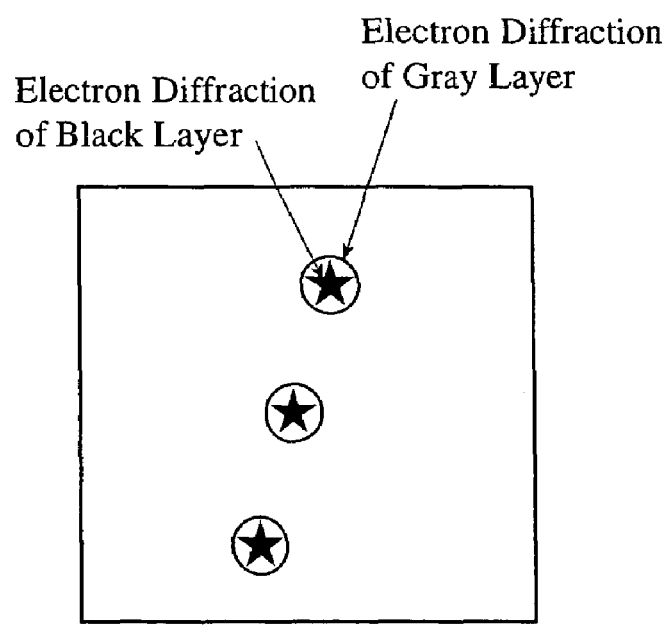
FIG. 9 is a schematic view corresponding to FIG. 8.

FIG. 8 shows an electron diffraction image of a region surrounded by a circle in FIG. 7, and FIG. 9 is a schematic view of FIG. 8. As is clear from FIGS. 8 and 9, the electron diffraction images of the black layers indicated by stars are substantially aligned with those of the gray layers indicated by circles, suggesting that the lattice stripes were continuous by an epitaxial relation in the boundary regions of the black layers and the gray layers. It is thus clear that the columnar crystal grains having a multi-layer structure are like a single crystal.

As the compositions of black layers and gray layers in the multi-layer columnar crystal grains in Example 10, the compositions at a point P (black layer) and a point Q (gray layer) in FIG. 6 were measured by an energy dispersive X-ray analyzer (EDX) attached to a transmission electron microscope. Table 3 shows the compositions of black layers and gray layers. Because the Si content difference exceeding 30 atomic % makes the crystal structure fine, the Si content difference should be controlled within 30 atomic %. Because the discharge output of $NbSi_2$ was 6.5 kW in Example 10, the Si content difference was 12.4 atomic %.

TABLE 3

| | Average Composition (atomic %) | | | |
|---|---|---|---|---|
| | Ti | Al | Nb | Si |
| Black Layer | 43.6 | 38.0 | 9.8 | 8.6 |
| Gray Layer | 39.6 | 27.3 | 12.1 | 21.0 |

Figure 10:
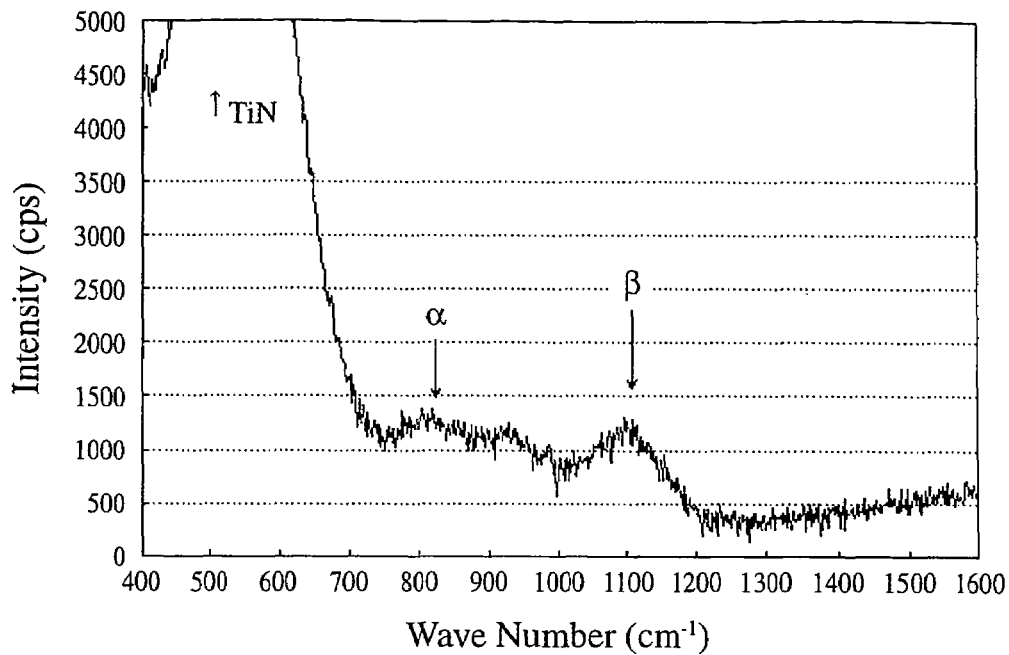
FIG. 10 is a graph showing the Raman spectroscopic observation results of the hard coating of Example 10.
Figure 11:
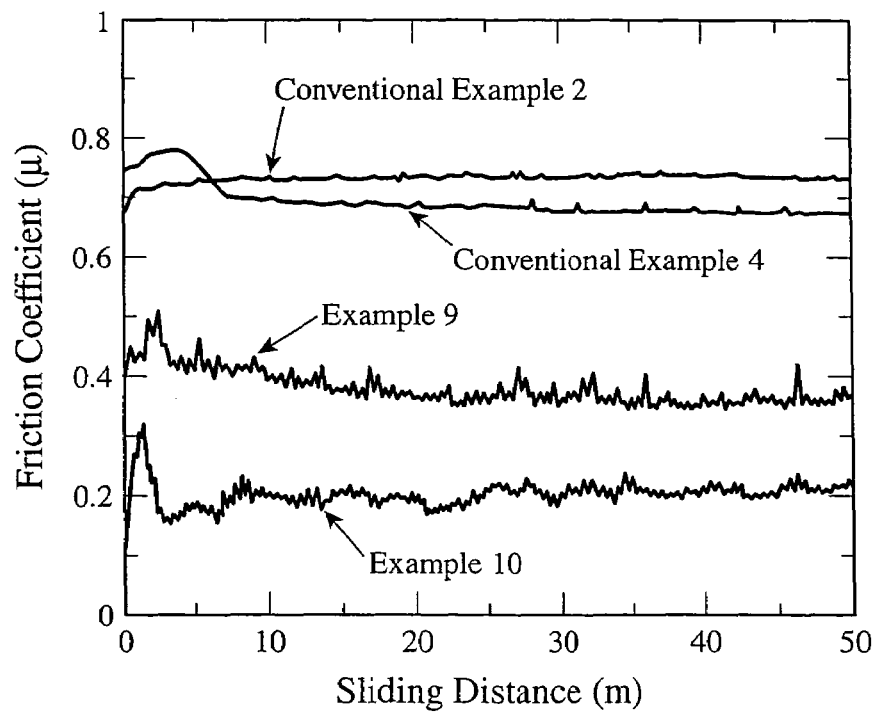
FIG. 11 is a graph showing the friction coefficients of Examples 9 and 10 and Conventional Examples 2 and 4.

Chemical conditions of Si in the hard coating of Example 10 were examined by Raman spectroscopy. As a result, as shown in FIG. 10, there were a $Si_3N_4$ peak of an α-crystal structure in a wave number range of 800-850 $cm^{-1}$, and a $Si_3N_4$ peak of a β-crystal structure in a wave number range of 1020-1170 $cm^{-1}$. FIG. 11 shows the friction coefficients of the hard coatings of Examples 9 and 10 and Conventional Examples 2 and 4 measured at 600° C. in the air, using a ball-on-disc-type friction wear tester. It is clear from FIG. 11 that the existence of Si in the hard coating dramatically improves lubrication.

The insert of Example 7 having a hard coating containing Si exhibited about 3 times as high cutting performance as that of the hard-coated insert of Comparative Example 7. The inclusion of Si dramatically reduced the friction coefficients of hard coatings having a basic composition of (TiAl)N. Further, the intermittent cutting of a work having fixed holes by the hard-coated insert of Example 10 under different conditions from above confirmed that even vigorous impact did not cause breakage, thereby securing stable cutting.

It is clear from the evaluation results shown in Table 2 that to provide the hard coating with improved lubrication and stable cutting performance, a Si-source target is preferably made of intermetallic compounds such as $NbSi_2$, $CrSi_2$, $WSi_2$, $TiSi_2$, etc., or alloys such as WSi, CrSi, NbSi, TiSi, etc.

Figure 12:
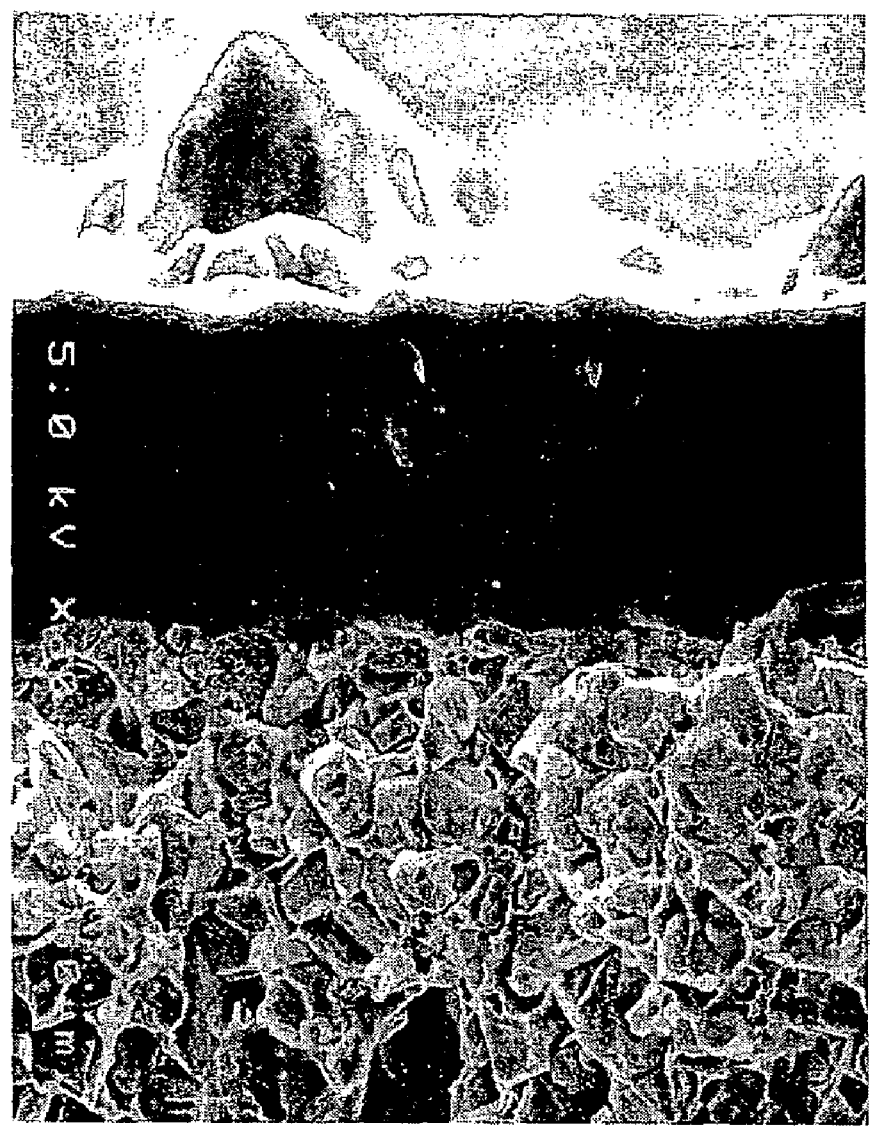
FIG. 12 is a scanning electron photomicrograph (magnification: 15,000) showing the structure of the hard coating of Comparative Example 7 on a fractured surface.

In the hard coatings of other Comparative Examples than Comparative Examples 4 and 8-10, the Si content was 30 atomic % or more. As is clear from FIG. 12, the hard coating of Comparative Example 7 having as large a Si content as 34.5 atomic % had an amorphous fine structure. Accordingly, the hard coating of Comparative Example 7 had as low hardness as 26 GPa.

The hard coating of Comparative Example 4 had Si—O bonds, with a Si content of 9.4 atomic % within the range of the present invention. However, because each layer in a multi-layer structure was as thick as 132.1 nm, it had a short life due to early wear. This seems to be due to the fact that because the discharge output of a CrSi target for the MS method was as high as 6.6 kW despite a high sputtering rate of an MS target of $CrSi_2$ unlike $NbSi_2$, each layer in the multi-layer structure was as thick as more than 100 nm, and because crystal lattice stripes were discontinuous because of strain in a lattice of each layer, the hard coating had a fine crystal structure.

In the hard coating of Comparative Example 10, the Si content was 6.9 atomic %, within the range of the present invention, and each layer was as thick as 31.4 nm. However, because of the lack of Si—O bonds, seizure was not fully suppressed at an early cutting stage. The absence of Si—O bonds appears to be due to the fact that oxygen was not contained in the reaction gas.

Si was not detected in the hard coatings of Comparative Examples 8 and 9. Also, layers in the multi-layer structures were as thin as 0.3 nm and 0.4 nm, respectively. Accordingly, seizure vigorously occurred at an early cutting stage in the cutting test. Particularly in Comparative Example 9, cutting evaluation was stopped because of sparks. This seems to be due to the fact that the discharge output of an MS target was as low as 0.5 kW.

The hard coating of Conventional Examples 1-5 formed by the AIP method only had extremely high hardness and residual compression stress and insufficient toughness, so that they are vulnerable to internal breakage. If a temperature, a bias voltage, a reaction pressure, are current and a target composition were controlled among film-forming conditions in the AIP method, toughness would be improved to some extent, but it would result in extreme decrease in hardness and wear resistance. Accordingly, inserts having the hard coatings of Conventional Examples 1-5 had a short life. Hard coatings formed by the low-plasma-density MS method only have low adhesion to a substrate and low hardness, resulting in coated inserts with short life.

EXAMPLE 15

A hard coating was formed on an insert in the same manner as in Example 14 except for adding no oxygen to the reaction gas. The resultant hard coating had a columnar structure and continuous crystal lattice stripes, with each layer having an average thickness of 33.6 nm. The Si content in the hard coating was 6.3 atomic %, with difference because of 10.7 atomic % of $Si_A$ and 1.9 atomic % of $Si_B$. However, the hard coating did not have Si—O bonds. Accordingly, the cuttable length was 19.4 m.

Though the hard coatings of the present invention were formed on inserts in the above Examples, they can also be formed on other tools. For instance, drills, end mills, punches, dies, etc. provided with the hard coatings of the present invention also exhibit excellent performance in intermittent cutting.

Because the hard coating of the present invention has a multi-layer structure comprising alternately laminated hard layers and soft layers of desired thickness, with a Si content continuously changing in a laminate direction, crystal lattice stripes being continuous in interlayer boundary regions, it has high hardness, high-temperature oxidation resistance, seizure resistance, impact resistance and toughness, with excellent adhesion to a substrate. Accordingly, a tool with the hard coating of the present invention exhibits excellent cutting performance, with a long life in dry high-efficiency cutting, and intermittent cutting of dies, etc.

What is claimed is:

1. A hard coating formed by a physical vapor deposition method, comprising metal elements comprising Si and at least one selected from the group consisting of transition metal elements of Groups 4a, 5a and 6a in the Periodic Table, Al and B, and at least one non-metal element selected from the group consisting of C, N and O, said hard coating having a columnar structure comprising columnar crystal grains, which columnar crystal grains comprise a multi-layer structure composed of pluralities of layers with Si content differences, crystal lattice stripes in interlayer boundary regions in said multi-layer structure being continuous, and each layer having a thickness of 0.1-100 nm.

2. The hard coating according to claim 1, comprising a Si-containing crystalline phase, which comprises $\alpha$-$Si_3N_4$ and $\beta$-$Si_3N_4$.

3. The hard coating according to claim 2, comprising bonds of Si and O.

4. The hard coating according to claim 3, whose surface is made smooth by machining.

5. The hard coating according to claim 2, whose surface is made smooth by machining.

6. The hard coating according to claim 1, comprising bonds of Si and O.

7. The hard coating according to claim 6, whose surface is made smooth by machining.

8. The hard coating according to claim 1, whose surface is made smooth by machining.

* * * * *